US006566148B2

(12) United States Patent
Hsu et al.

(10) Patent No.: US 6,566,148 B2
(45) Date of Patent: May 20, 2003

(54) METHOD OF MAKING A FERROELECTRIC MEMORY TRANSISTOR

(75) Inventors: Sheng Teng Hsu, Camas, WA (US); Tingkai Li, Vancouver, WA (US); Bruce D. Ulrich, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/929,710

(22) Filed: Aug. 13, 2001

(65) Prior Publication Data

US 2003/0032206 A1 Feb. 13, 2003

(51) Int. Cl.[7] .................. H01L 21/00; H01L 21/8242; H01L 21/302; H01L 21/461
(52) U.S. Cl. ................. 438/3; 438/240; 438/253; 438/692; 438/722
(58) Field of Search .................. 438/3, 240, 241, 438/239, 250, 253, 692, 722

(56) References Cited

U.S. PATENT DOCUMENTS

| 5,300,799 | A | * | 4/1994 | Nakamura et al. | 257/295 |
| 5,303,182 | A | * | 4/1994 | Nakao et al. | 365/145 |
| 5,580,814 | A | * | 12/1996 | Larson | 438/3 |
| 5,591,663 | A | * | 1/1997 | Nasu et al. | 438/3 |
| 5,907,762 | A | * | 5/1999 | Evans et al. | 438/3 |
| 6,011,285 | A | * | 1/2000 | Hsu et al. | 257/295 |
| 6,022,774 | A | * | 2/2000 | Kawai et al. | 438/240 |
| 6,048,738 | A | * | 4/2000 | Hsu et al. | 438/3 |
| 6,150,183 | A | * | 11/2000 | Fukuda et al. | 438/3 |
| 6,194,752 | B1 | * | 2/2001 | Ogasahara et al. | 257/295 |
| 6,211,034 | B1 | * | 4/2001 | Visokay et al. | 438/396 |
| 6,291,251 | B1 | * | 9/2001 | Nam | 438/3 |
| 6,294,805 | B1 | * | 9/2001 | Jung | 257/295 |
| 6,429,476 | B2 | * | 8/2002 | Suzuki et al. | 257/296 |
| 6,437,387 | B2 | * | 8/2002 | Gutsche | 257/301 |

FOREIGN PATENT DOCUMENTS

JP          358093331 A  *  6/1983

* cited by examiner

Primary Examiner—Matthew Smith
Assistant Examiner—Chuong A Luu
(74) Attorney, Agent, or Firm—David C. Ripma; Matthew D. Rabdau; Scott C. Krieger

(57) ABSTRACT

A method of making a ferroelectric memory transistor includes preparing a silicon substrate including forming plural active areas thereon; depositing a layer of gate insulator on the substrate, and depositing a layer of polysilicon over the gate insulator layer; forming a source region, a drain region and a gate electrode; depositing a layer of bottom electrode material and finishing the bottom electrode without damaging the underlying gate insulator and silicon substrate; depositing a layer of ferroelectric material on the bottom electrode; depositing a layer of top electrode material on the ferroelectric material; and finishing the transistor, including passivation oxide deposition, contact hole etching and metalization.

22 Claims, 5 Drawing Sheets

METHOD OF MAKING A FERROELECTRIC MEMORY TRANSISTOR

FIELD OF THE INVENTION

This invention relates to high density integrated circuit non-volatile memory, and specifically to a method of making a ferroelectric device wherein etching of a bottom electrode is accomplished without damaging the underlying substrate.

BACKGROUND OF THE INVENTION

One of the most difficult steps in metal/ferro metal oxide semiconductor (MFMOS) ferroelectric memory transistor fabrication is that of etching the bottom electrode. In known NFMOS ferroelectric memory transistor fabrication, the bottom electrode must be selectively etched, without etching through the thin oxide located beneath the bottom electrode, and thereby penetrating the silicon substrate. The oxide located below the bottom electrode may be silicon dioxide, or any other suitable high-k insulator. If the silicon substrate is inadvertently etched, it will be impossible to form source/drain junctions which have adequate connections to the conductive channel of the transistor.

SUMMARY OF THE INVENTION

A method of making a ferroelectric memory transistor includes preparing a silicon substrate including forming plural active areas thereon; depositing a layer of gate insulator on the substrate, and depositing a layer of polysilicon over the gate insulator layer; forming a source region, a drain region and a gate electrode; depositing a layer of bottom electrode material and finishing the bottom electrode without damaging the underlying gate insulator and silicon substrate; depositing a layer of ferroelectric material on the bottom electrode, depositing a layer of top electrode material on the ferroelectric material; and finishing the transistor, including passivation oxide deposition, contact hole etching and metalization.

An object of the invention is to provide a production method for single transistor ferroelectric memory device fabrication.

Another object of the invention is to provide a method of forming a bottom electrode in a ferroelectric stack without penetrating the underlying silicon substrate.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENT

Figure 1:
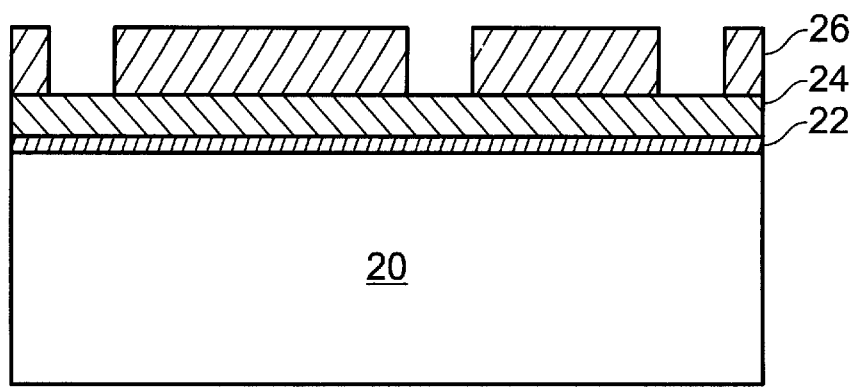
FIGS. 1–10 depict successive steps in a first embodiment of the method of the invention.

The fabrication process for a ferroelectric memory transistor constructed according to the method of the invention does not require highly selective etching for the electrode etching process. Referring initially to FIG. 1, a silicon substrate 20 is a p-type silicon wafer. Boron is implanted into what will become the p-well regions of the wafer. The implanted wafer is heated to diffuse the implanted ions to form a p-well. A thin layer of gate insulator 22, such as a layer of gate oxide, is grown and a layer of undoped polysilicon 24 is deposited. Alternately, the gate oxide may be replaced with a layer of high-k gate dielectric. A layer of photoresist 26 is applied prior to a trench isolation process, as shown in FIG. 1. The figures depict the construction of two transistors wherein the left side of the drawing figure depicts one transistor and the right side of the drawing figure depicts a second transistor, turned 90° from the view of the left side of the drawing figure.

Figure 2:
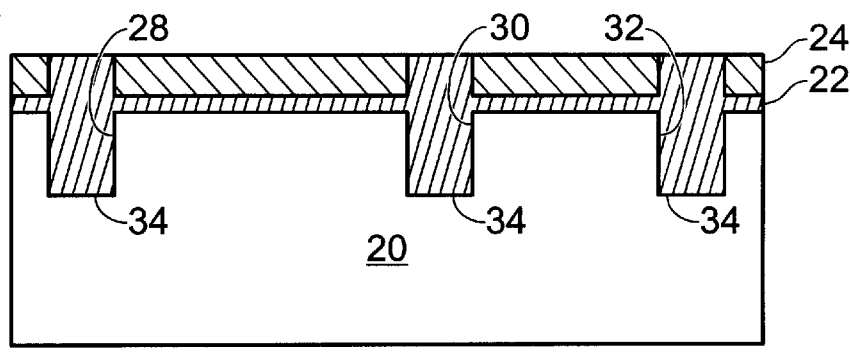

Turning to FIG. 2, shallow trenches 28, 30, 32 are etched through the polysilicon, the gate insulator and through about 500 nm of silicon substrate. The photoresist is then removed. Any plasma etching damage is removed, the wafer is cleaned, and a layer of oxide 34 is deposited onto the wafer. The thickness of the oxide is at least 1.5 times, and may be more than 2 times thicker than the depth of the shallow trenches. CMP is used, stopping at the level of polysilicon, to planarize the wafer. All of the polysilicon, except that on the active areas, is removed, as shown in FIG. 2.

Figure 3:
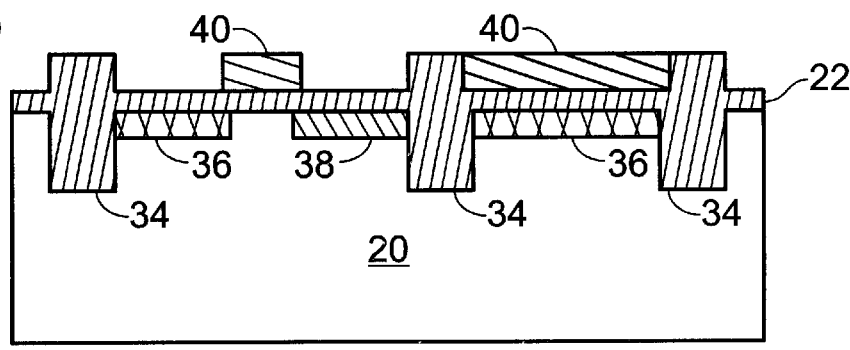
Figure 4:
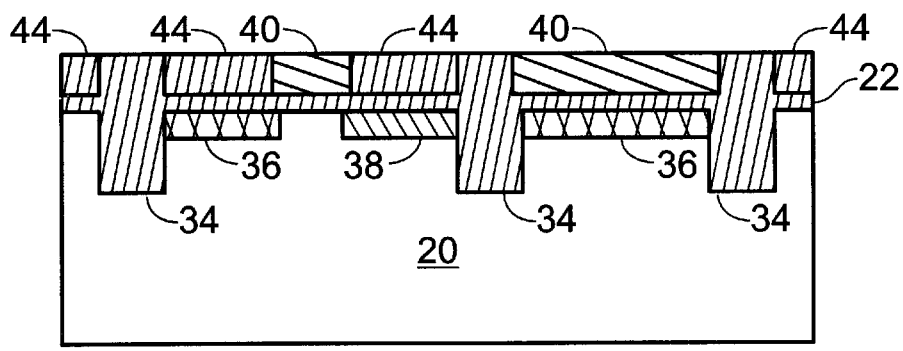
Figure 5:
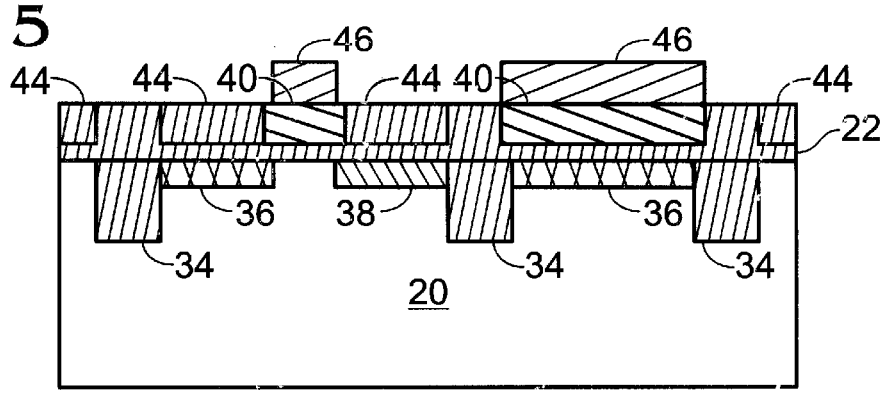
Figure 6:
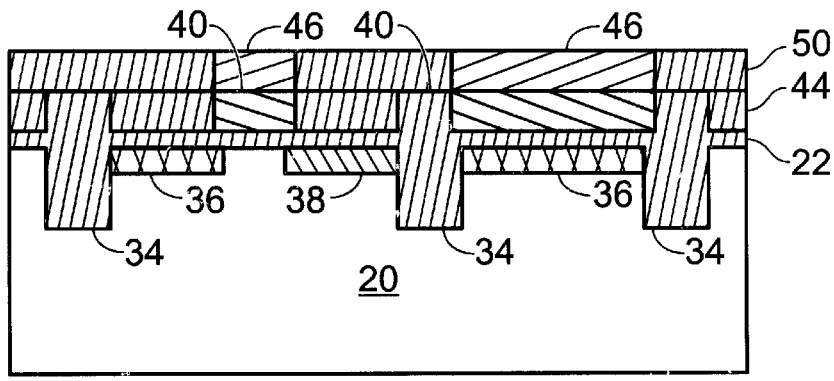

Photoresist is applied and the polysilicon selectively etched to form a source area 36 and a drain area 38, and to form a gate electrode 40. The source and drain of the device is implanted with arsenic or phosphorus ions, as shown in FIG. 3. Exemplar implantation specification are by implantation of arsenic ions, at a dose of about $1 \cdot 10^{15}$ $cm^{-2}$ to $5 \cdot 10^{15}$ $cm^{-2}$, and at an energy level of 30 keV to 60 keV, or implantation of phosphorus ions, at a dose of about $1 \cdot 10^{15}$ $cm^{-2}$ to $5 \cdot 10^{15}$ $cm^{-2}$, and at an energy level of 10 keV to 30 keV, to form N+, heavily doped polysilicon. A thin layer of oxide 44 is deposited onto the wafer and the wafer is CMP plainarized, as shown in FIG. 4.

Bottom electrodes 46 are deposited onto the wafer, and are finished by etching or CMP, without damaging underlying gate insulator layer 22 or silicon substrate 20. If the bottom electrode cannot be removed by a CNIP process, such as when pure iridium is used as the bottom electrode, photoresist is applied prior to etching of the bottom electrode. With respect to conventional etching techniques, the bottom electrode has very similar characteristics to the remaining polysilicon gate, which assists in stopping the downward penetration of the etching process. In this embodiment of the method of the invention, bottom electrode 46 and polysilicon 40 are not perfectly aligned, as shown in FIGS. 5 to 12. A thin layer of oxide 50 is deposited and is plainarized by CMP, resulting in the structure shown in FIG. 6.

If the bottom electrode is formed of a material which may be polished, such as Pt, TiN, Ta, TaN, TiTaN, IrTa alloy and IrPt alloy, the steps of the preceding paragraph are replaced by selective etching of portions of N+ polysilicon, deposition of bottom electrode material, and CMP of the bottom electrode. In this case, the bottom electrode and the n+ polysilicon are self-aligned. The underlying oxide layer 22 and silicon substrate 20 are protected from penetration during polishing of the bottom electrode.

Figure 7:
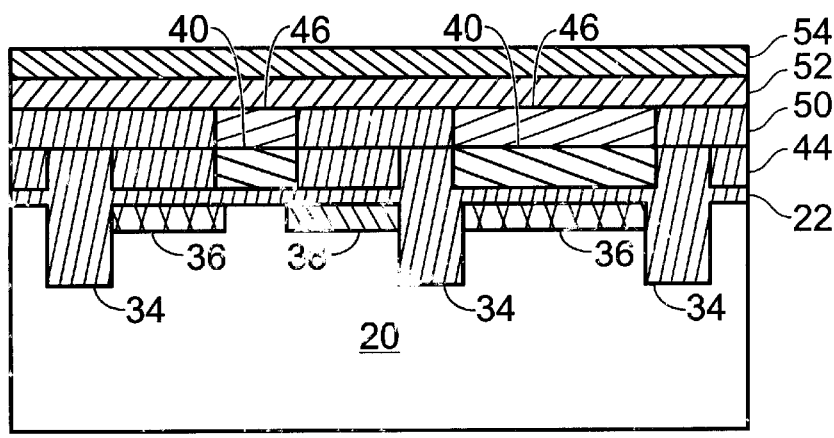
Figure 8:
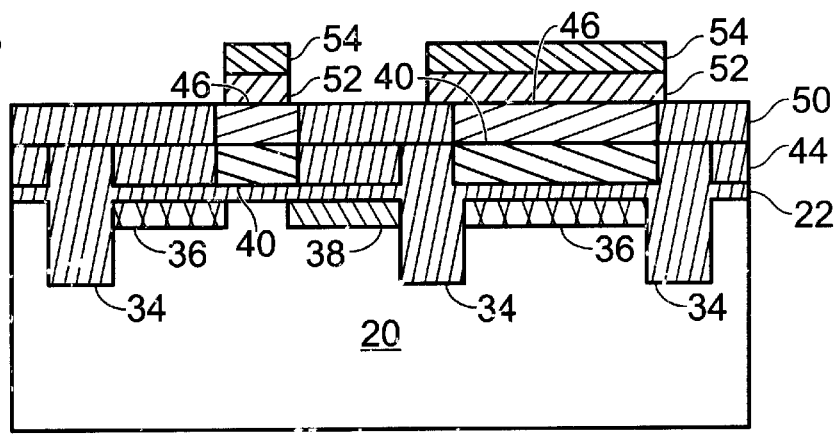

The wafer is now ready for deposition of the ferroelectric material. After a layer of ferroelectric thin film material 52 is deposited, the top electrode material 54 is deposited, as shown in FIG. 7.

Photoresist is applied to mask the top electrode prior to etching. Top electrode 54 functions as a control gate, therefore, it extends beyond the horizontal boundaries of the active area. The ferroelectric thin film may also be etched during this step, with the resulting structure depicted in FIG. 8. However, because etching a ferroelectric thin film usually degrades the ferroelectric property of the thin film, etching the ferroelectric thin film may be done in a separate step, using techniques less likely to degrade the ferroelectric properties of the thin film.

Figure 9:
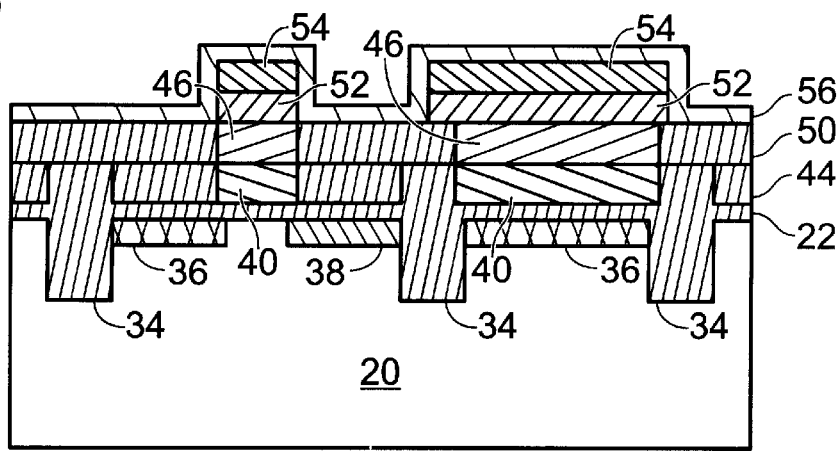

A thin layer of dielectric 56, such as titanium oxide or aluminum oxide, is deposited to protect the ferroelectric thin film from hydrogen damage, as shown in FIG. 9.

Figure 10:
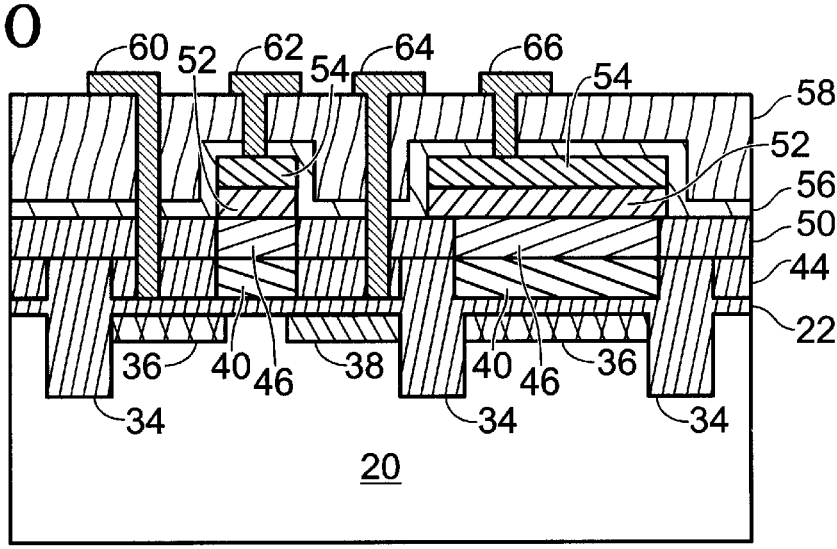

The remaining steps of passivation oxide deposition 58, contact hole etching and metallization 60, 62, 64 and 66, may be accomplished using any state-of-the-art process, resulting in the finished structure depicted in FIG. 10.

Figure 11:
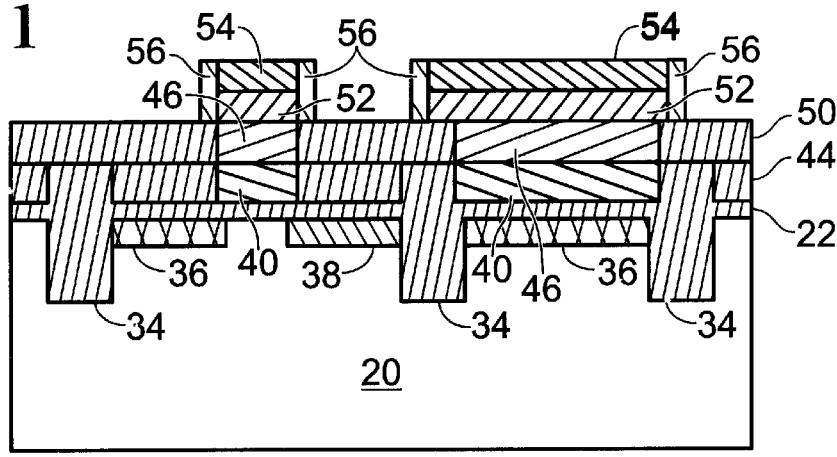
FIGS. 11–12 depict successive steps in a second embodiment of the method of the invention.
Figure 12:
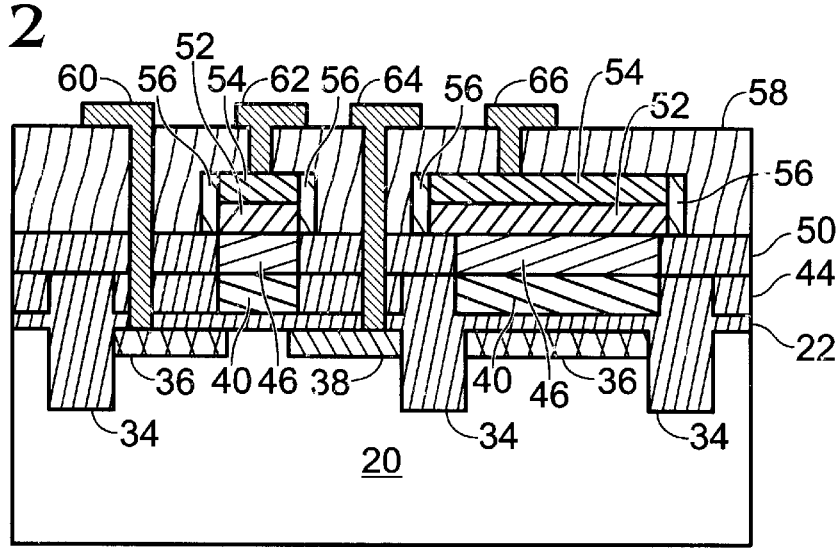

Optionally, the structure of FIG. 9 may be masked an a plasma etch process used to remove the horizontally disposed portions of the dielectric thin film, except on the sidewall of the top electrode and ferroelectric stack, as is shown in FIG. 11. The finished structure for this embodiment of the method of the invention is depicted in FIG. 12.

Figure 13:
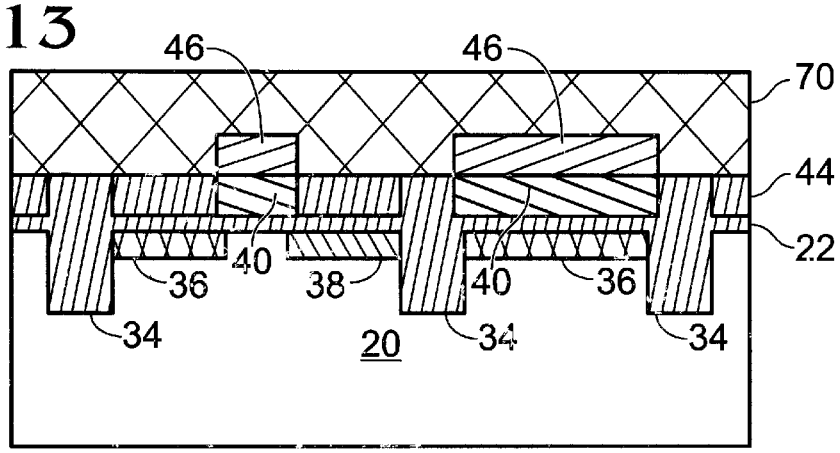
FIGS. 13–16 depict successive steps in an alternate embodiment of the method of the invention.
Figure 14:
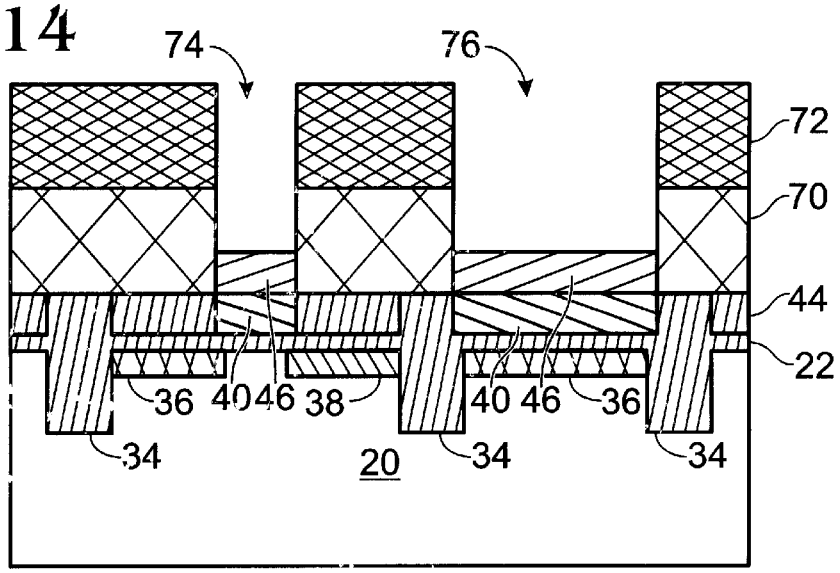

Several alternative steps may be performed during fabrication of a ferroelectric memory transistor according to the method of the invention. One alternative step take place after those steps described in connection with FIG. 6, wherein a thin layer oxide 70, having a thickness of between about 100 nm to 400 nm, is deposited as is shown in FIG. 13, over the already-deposited oxide and the bottom electrode. Photoresist 72 is applied, and the oxide is etched to open holes 74, 76 where ferroelectric memory material is to be deposited for the memory transistor, as shown in FIG. 14. The resist is then removed.

Figure 15:
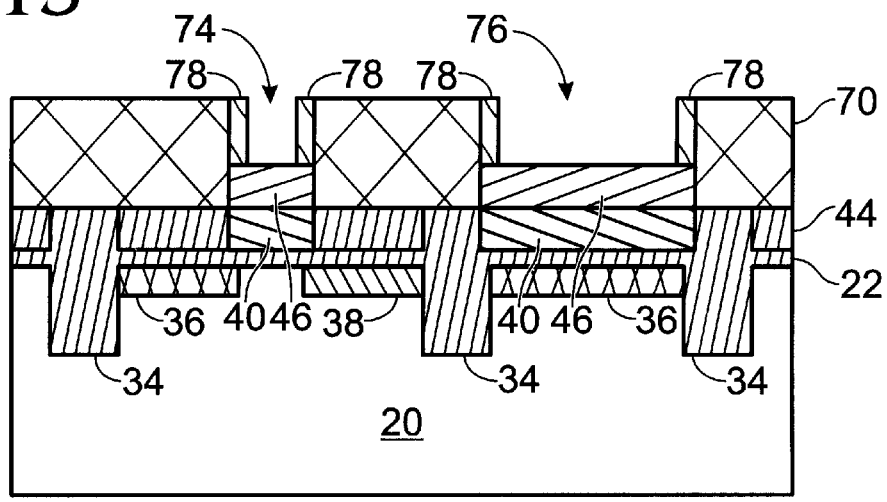

A thin layer of barrier dielectric 78, such as titanium oxide or aluminum oxide, is deposited and is plasma etched to form a protective layer at the sidewall of the holes previously opened, as is shown in FIG. 15.

Ferroelectric material 52 is then deposited onto the wafer. Although both MOCVD and spin-on coating may be applied, the spin-on coating is preferred. A low viscosity precursor spin-on coating will fill the holes more economically. The ferroelectric material on the top surface is etched. This may be achieved with or without an etch mask, or by a CMP process. If the etching is done without a mask, the etching also etches a portion of the ferroelectric material at the transistor area, that is, in the hole area.

Figure 16:
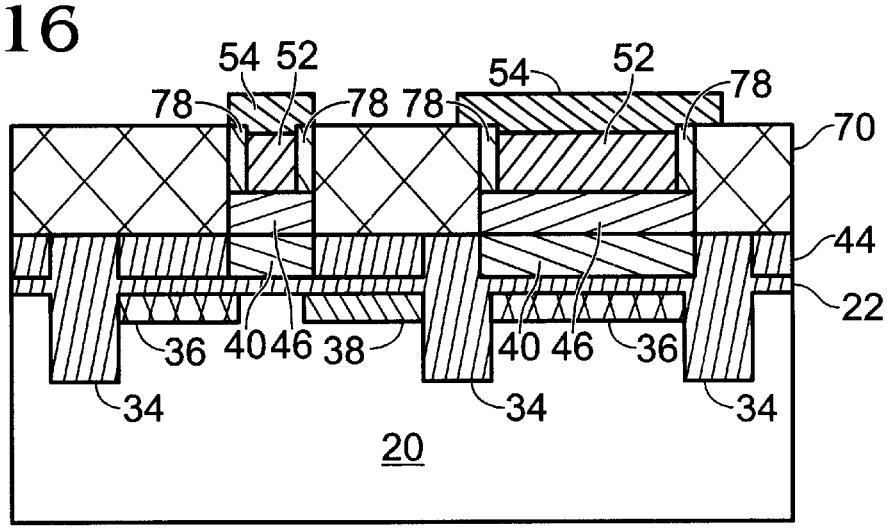

The remaining ferroelectric material thickness is the required ferroelectric material thickness for the memory transistor. Top electrode 54 is deposited and etched to form the control gate of the memory transistor, as shown in FIG. 16. The remaining process steps of CVD of oxide, application of photoresist prior to opening contact holes, and final metallization may be accomplished by any of the state-of-the-art techniques.

Thus, a method of making a ferroelectric memory transistor has been disclosed. It will be appreciated that further variations and modifications thereof may be made within the scope of the invention as defined in the appended claims.

We claim:

1. A method of making a ferroelectric memory transistor comprising:

preparing a silicon substrate including forming plural active areas thereon;

depositing a layer of gate insulator on the substrate, and depositing a layer of polysilicon over the gate insulator layer, forming in each said active area, a source region, a drain region and a gate active area, and including a gate electrode forward on said gate active area;

depositing a layer of bottom electrode material and finishing the bottom electrode without damaging the underlying gate insulator and silicon substrate;

depositing a layer of ferroelectric material on the bottom electrode:

depositing a layer of top electrode material on the ferroelectric material;

etching the top electrode material and the ferroelectric material leaving the top electrode material and the ferroelectric material longer than a gate formed on gate active area on the substrate, extending beyond the fore-and-aft horizontal boundaries of the active area, and narrower than a gate active area on the substrate within right-and-left boundaries of the gate active area; and finishing the transistor, including passivation oxide deposition, contact hole etching and metalization.

2. The method of claim 1 wherein said depositing a layer of bottom electrode material includes depositing a layer of iridium and finishing the bottom electrode by etching.

3. The method of claim 1 wherein said depositing a layer of bottom electrode material and finishing the bottom electrode without damaging the underlying gate insulator and silicon substrate includes depositing a layer of iridium, applying photoresist to the active area and etching the bottom electrode layer to form a bottom electrode.

4. The method of claim 1 wherein said depositing a layer of bottom electrode material includes depositing a layer of material taken from the group of materials consisting of Pt, TiN, Ta, TaN TiTaN, IrTa alloy and IrPt alloy; and CMP of the bottom electrode layer.

5. The method of claim 1 wherein said depositing a layer of bottom electrode material and finishing the bottom electrode without damaging the underlying gate insulator and silicon substrate includes selectively etching the N+ polysilicon, depositing a layer of bottom electrode material taken from the group of material consisting of Pt, TiN, Ta, TaN, TiTaNi, IrTa alloy and IrPt alloy, and finishing the bottom electrode by CMP.

6. The method of claim 1 which includes depositing a layer of barrier dielectric material over the top electrode and ferroelectric material.

7. The method of claim 6 which includes removing the barrier dielectric from the top surface of the top electrode and underlying structures, leaving barrier dielectric only on the sidewalls of the top electrode and ferroelectric stack.

8. The method of claim 1 which includes depositing a layer of oxide over the bottom electrode and etching the oxide to form an open hole; depositing a barrier dielectric and anisotropically etching the barrier dielectric except on the sidewall in the open hole; and building the ferroelectric and top electrode stack in the open hole.

9. The method of claim 8 wherein said depositing a layer of oxide over the bottom electrode includes depositing a layer of oxide having a thickness of between about 100 nm to 400 nm.

10. The method of claim 1 wherein said depositing a layer of gate insulator includes depositing a layer of gate oxide.

11. The method of claim 1 wherein said depositing a layer of gate insulator includes depositing a layer of high-k gate dielectric.

12. A method of making a ferroelectric memory transistor comprising:

preparing a silicon substrate including forming plural active areas thereon;

depositing a layer of gate insulator on the substrate, and depositing a layer of polysilicon over the gate insulator layer;

forming shallow trenches through the layers into the substrate to define active areas, and depositing oxide to till the trenches and to cover the substrate to a depth of at least 1.5 times the depth of the trenches;

forming in each said active area, a source region, a drain region and a gate active area, and including a gate electrode formed on said gate active area;

depositing a layer of bottom electrode material and finishing the bottom electrode without damaging the underlying gate-insulator and silicon substrate;

depositing a layer of ferroelectric material on the bottom electrode;

depositing a layer of top electrode material on the ferroelectric material;

etching the top electrode material and the ferroelectric material leaving the top electrode material and the ferroelectric material longer than a gate formed on gate active area on the substrate extending beyond the fore-and-aft horizontal boundaries of the active area, narrower than a gate active area on the substrate and within right-and-left boundaries of the gate active area;

providing a barrier dielectric layer about the top electrode material and the ferroelectric material; and finishing the transistor, including passivation oxide deposition, contact hole etching and metalization.

13. The method of claim 12 wherein said depositing a layer of bottom electrode material includes depositing a layer of iridium and finishing the bottom electrode by etching.

14. The method of claim 12 wherein said depositing a layer of bottom electrode material and finishing the bottom electrode without damaging the underlying gate insulator and silicon substrate includes depositing a layer of iridium, applying photoresist to the active area and etching the bottom electrode layer to form a bottom electrode.

15. The method of claim 12 wherein said depositing a layer of bottom electrode material includes depositing a layer of material taken from the group of materials consisting of Pt, TiN, Ta, TaN, TiTaN, IrTa alloy and IrPt alloy; and CMP of the bottom electrode layer.

16. The method of claim 12 wherein said depositing a layer of bottom electrode material and finishing the bottom electrode without damaging the underlining gate insulator and silicon substrate includes selectively etching the N+ polysilicon, depositing a layer of bottom electrode material taken from the group of material consisting of Pt, TiN, Ta, TaN, TiTaN, IrTa alloy and IrPt alloy, and finishing the bottom electrode by CMP.

17. The method of claim 12 wherein said providing a barrier dielectric layer about the top electrode material and the ferroelectric material includes depositing a layer of barrier dielectric material over the top electrode and ferroelectric material.

18. The method of claim 17 which includes removing the barrier dielectric from the top surface of the top electrode and underlying structures, leaving barrier dielectric only on the sidewalls of the top electrode and ferroelectric stack.

19. The method of claim 12 which includes depositing a layer of oxide over the bottom electrode and etching the oxide to form an open hole; and wherein said providing a barrier dielectric layer about the top electrode material and the ferroelectric material includes depositing a barrier dielectric sidewall in the open hole; and building the ferroelectric and top electrode stack in the open hole.

20. The method of claim 19 wherein said depositing a layer of oxide over the bottom electrode includes depositing a layer of oxide having a thickness of between about 100 nm to 400 nm.

21. The method of claim 12 wherein said depositing a layer of gate insulator includes depositing a layer of gate oxide.

22. The method of claim 12 wherein said depositing a layer of gate insulator includes depositing a layer of high-k gate dielectric.

* * * * *